(12) United States Patent
Arai et al.

(10) Patent No.: US 7,280,328 B2
(45) Date of Patent: *Oct. 9, 2007

(54) SEMICONDUCTOR INTEGRATED CIRCUIT DEVICE

(75) Inventors: Katsuya Arai, Kyoto (JP); Toshihiro Kohgami, Kyoto (JP); Shiro Usami, Kyoto (JP); Hiroaki Yabu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 462 days.

This patent is subject to a terminal disclaimer.

(21) Appl. No.: 10/827,442

(22) Filed: Apr. 20, 2004

(65) Prior Publication Data

US 2005/0018370 A1  Jan. 27, 2005

(30) Foreign Application Priority Data

Jul. 24, 2003  (JP) ............... 2003-278876

(51) Int. Cl.
  *H02H 9/00*  (2006.01)
  *H02H 3/22*  (2006.01)
  *H01L 23/62* (2006.01)
(52) U.S. Cl. .................. 361/56; 361/111; 257/362
(58) Field of Classification Search .................. 361/56, 361/111; 257/362
  See application file for complete search history.

(56) References Cited

U.S. PATENT DOCUMENTS 6,437,407 B1 * 8/2002 Ker et al. .................. 257/357
6,455,902 B1 * 9/2002 Voldman .................... 257/378
6,552,886 B1 * 4/2003 Wu et al. .................... 361/56
6,920,026 B2 * 7/2005 Chen et al. .................. 361/56

FOREIGN PATENT DOCUMENTS

| JP | 7-22617 | 1/1995 |
| JP | 07-503599 | 4/1995 |
| JP | 08-055958 | 2/1996 |
| JP | 08-097362 | 4/1996 |
| JP | 10-209292 | 8/1998 |
| JP | 2003-031672 A | 1/2003 |
| WO | WO 93/15541 | 8/1993 |

* cited by examiner

*Primary Examiner*—Michael Sherry
*Assistant Examiner*—Dharti H Patel
(74) *Attorney, Agent, or Firm*—McDermott Will & Emery LLP

(57) ABSTRACT

An inventive semiconductor integrated circuit device includes: an external connection terminal 1; an electrostatic discharge protection circuit 2; an output circuit 3; an output prebuffer circuit 4; an input prebuffer circuit 5; an internal circuit 41; an inter-power supply electrostatic discharge protection circuit 6; and a gate voltage control circuit 7. The gate voltage control circuit 7 has a capacitor 25 and a resistor 26, and the inter-power supply electrostatic discharge protection circuit 6 has an NMIS transistor 24. When a positive surge is applied to the external connection terminal 1, the gate potential of the NMIS transistor 24 is also increased. Thus, the NMIS transistor 24 is turned on, and the positive electrical charge supplied to the external connection terminal 1 is discharged toward a ground line 23.

10 Claims, 10 Drawing Sheets

SEMICONDUCTOR INTEGRATED CIRCUIT DEVICE

BACKGROUND OF THE INVENTION

The present invention relates to a semiconductor integrated circuit device including an electrostatic discharge (ESD) protection circuit, and more particularly relates to a semiconductor integrated circuit device including an ESD protection circuit having an improved capability for protecting an input circuit, an output circuit, an input/output circuit and an internal circuit from ESD.

In recent years, in the processing of semiconductor integrated circuit devices, the level of integration has been increased in accordance with technical advances in miniaturization and achievement of higher density. Accordingly, semiconductor integrated circuit devices are vulnerable to damage caused by electrostatic discharge (hereinafter, called "surge"). For example, a surge penetrated from an external connection terminal might destroy an element such as an input circuit, an output circuit, an input/output circuit or an internal circuit, thus increasing the possibility of a reduction in performance of the element. Therefore, if a semiconductor integrated circuit device is provided with an external connection terminal, the device often includes a protection circuit for protecting an input circuit, an output circuit, an input/output circuit or an internal circuit from a surge. Such a protection circuit is herein called an "electrostatic discharge protection circuit".

FIG. 9 is an electric circuit diagram illustrating the configuration of an output circuit of a conventional semiconductor integrated circuit device including an electrostatic discharge protection circuit, and the periphery of the output circuit. As shown in FIG. 9, the conventional semiconductor integrated circuit device includes: an external connection terminal 101; an electrostatic discharge protection circuit 102; an output circuit 103; an output prebuffer circuit 104; an internal circuit 121; and an inter-power supply electrostatic discharge protection circuit 122. Herein, the "inter-power supply electrostatic discharge protection circuit" refers to the electrostatic discharge protection circuit located between a line through which a power supply voltage $V_{DD}$ is supplied and another line through a ground voltage Vss is supplied. The electrostatic discharge protection circuit 102 and the inter-power supply electrostatic discharge protection circuit 122 are provided so as to protect the output circuit 103 from a surge penetrated from the external connection terminal 101.

The electrostatic discharge protection circuit 102 is provided between the external connection terminal 101 and the output circuit 103, and has a PMIS transistor 105, an NMIS transistor 106, a resistor 107 and a resistor 108. As used herein, "PMIS transistor" refers to a p-channel MIS transistor, and "NMIS transistor" refers to an n-channel MIS transistor. The PMIS transistor 105 has: a source connected to a power supply line 119 through which the power supply voltage $V_{DD}$ is supplied; a gate connected to the power supply line 119 with the resistor 107 interposed therebetween; a drain connected to the external connection terminal 101; and a substrate region (n-well) connected to the power supply line 119. On the other hand, the NMIS transistor 106 has: a source connected to a ground line 120; a gate connected to the ground line 120 with the resistor 108 interposed therebetween; a drain connected to the external connection terminal 101; and a substrate region (p-well) connected to the ground line 120.

The output circuit 103 is provided between the electrostatic discharge protection circuit 102 and the output prebuffer circuit 104, and has a PMIS transistor 111 and an NMIS transistor 112. The PMIS transistor 111 has: a source connected to the power supply line 119; a gate connected to an output terminal of a first prebuffer 115 of the output prebuffer circuit 104; a drain connected to the external connection terminal 101; and a substrate region (n-well) connected to the power supply line 119. On the other hand, the NMIS transistor 112 has: a source connected to the ground line 120; a gate connected to an output terminal of a second prebuffer 117 of the output prebuffer circuit 104; a drain connected to the external connection terminal 101; and a substrate region (p-well) connected to the ground line 120.

The output prebuffer circuit 104 serves to amplify an output signal from the internal circuit 121, and is provided between the internal circuit 121 and the output circuit 103. The output prebuffer circuit 104 has: a first prebuffer circuit 116 provided at its last stage with the first prebuffer 115; and a second prebuffer circuit 118 provided at its last stage with a second prebuffer 117. The first prebuffer 115 is provided with: a terminal which is connected to the power supply line 119 and through which a power supply voltage is supplied; a ground terminal connected to the ground line 120; an output terminal connected to the gate of the PMIS transistor 111 of the output circuit 103; and an input terminal connected to the internal circuit 121. On the other hand, the second prebuffer 117 is provided with: a terminal which is connected to the power supply line 119 and through which a power supply voltage is supplied; a ground terminal connected to the ground line 120; an output terminal connected to the gate of the NMIS transistor 112 of the output circuit 103; and an input terminal connected to the internal circuit 121. It should be noted that the first and second prebuffer circuits 116 and 118 are each provided with prebuffers whose number is determined in accordance with the degree of amplification of an output signal from the internal circuit 121. Output signals whose levels are identical or opposite to each other are sent from the output terminal of the first prebuffer 115 at the last stage of the first prebuffer circuit 116 and that of the second prebuffer 117 at the last stage of the second prebuffer circuit 118.

The inter-power supply electrostatic discharge protection circuit 122 is provided between the power supply line 119 and the ground line 120, and has an NMIS transistor 123. The NMIS transistor 123 has: a source connected to the ground line 120; a gate connected to the ground line 120 with a resistor 124 interposed therebetween; a drain connected to the power supply line 119; and a substrate region (p-well) connected to the ground line 120.

In the conventional semiconductor integrated circuit device implemented as described above, a surge applied between the power supply line 119 and the external connection terminal 101 is absorbed due to the breakdown of the PMIS transistor 105, while a surge applied between the ground line 120 and the external connection terminal 101 is absorbed due to the breakdown of the NMIS transistor 106. Thus, the output circuit 103 is protected from a surge penetrated from outside through the external connection terminal 101.

Semiconductor integrated circuit devices must ensure, for users, resistance to destruction caused by surge, and thus need to meet ESD test standards. Recently, as the ESD test standards, human body model (HBM) test standards, typified by MIL-STD, have been used as global standards, and therefore, semiconductor integrated circuit devices are required to meet such standards.

FIGS. 10A and 10B are a circuit diagram illustrating an evaluation circuit for carrying out an ESD test according to HBM test standards, and a graph showing the waveform of surge current passed through the evaluation circuit in carrying out the test according to the HBM test standards, respectively.

As shown in FIG. 10A, the evaluation circuit includes two sub-circuits provided in parallel with respect to a charge and discharge capacitor 151 having a capacitance C of 100 pF (one of the two sub-circuits is shown in the left-hand part of FIG. 10A, while the other sub-circuit is shown in the right-hand part of FIG. 10A). The sub-circuit shown in the left-hand part of FIG. 10A is provided with a voltage-variable charge power supply 150, while the sub-circuit shown in the right-hand part of FIG. 10A is provided with a discharge resistor 153 having a resistance R of 1.5 kΩ. The evaluation circuit further includes a selector switch 152 connected to one electrode of the charge and discharge capacitor 151. Via the selector switch 152, a high-voltage section of the charge power supply 150 and the discharge resistor 153 are alternately connected to said one electrode of the charge and discharge capacitor 151. The other electrode of the charge and discharge capacitor 151 is connected to a low-voltage section of the charge power supply 150 in the sub-circuit shown in the left-hand part of FIG. 10A, and is connected to the discharge resistor 153 in the sub-circuit shown in the right-hand part of FIG. 10A. In the sub-circuit shown in the right-hand part of FIG. 10A, a device to be tested 154 is interposed between the other electrode of the charge and discharge capacitor 151 and the discharge resistor 153 so as to carry out an ESD test on the device to be tested 154.

In carrying out an ESD test using this evaluation circuit, first, said one electrode of the charge and discharge capacitor 151 is connected to the charge power supply 150 via the selector switch 152. Thus, the sub-circuit shown in the left-hand part of FIG. 10A becomes a closed circuit, and the charge power supply 150 allows electrical charges to be accumulated in the charge and discharge capacitor 151. The charging voltage at this time is 4000 V, for example. Thereafter, said one electrode of the charge and discharge capacitor 151 is connected to the discharge resistor 153 via the selector switch 152. Thus, the sub-circuit shown in the right-hand part of FIG. 10A becomes a closed circuit, and the electrical charges accumulated in the charge and discharge capacitor 151 are applied to the semiconductor integrated circuit device, i.e., the device to be tested 154, through the discharge resistor 153.

In this case, the test is carried out in accordance with the waveform as shown in FIG. 10B. In FIG. 10B, the abscissa axis represents a period of time during which stress is applied, the ordinate axis represents surge current (A), Tr represents rise time (ns), and Td represents damping time (ns).

In the conventional semiconductor integrated circuit device shown in FIG. 9, during normal operation, power supply voltage $V_{DD}$ and ground voltage Vss are applied to the power supply line 119 and the ground line 120, respectively. In carrying out an ESD test according to the HBM test standards, there is the case where positive and negative surges are applied to the external connection terminal 101 with the ground voltage Vss used as the reference, and there is also the case where positive and negative surges are applied to the external connection terminal 101 with the power supply voltage $V_{DD}$ used as the reference. The status in which the ground voltage Vss is used as the reference means that the voltage of the power supply line 119 is not fixed but placed in an open state, and the voltage of the ground line 120 is fixed at the ground voltage Vss. On the other hand, the status in which the power supply voltage $V_{DD}$ is used as the reference means that the voltage of the power supply line 119 is fixed at the power supply voltage $V_{DD}$, and the voltage of the ground line 120 is not fixed but placed in an open state.

To describe the sub-circuit at the right-hand part of the evaluation circuit shown in FIG. 10A, the voltage between the two electrodes of the charge and discharge capacitor 151 is applied to the discharge resistor 153 and the semiconductor integrated circuit device (i.e., the device to be tested 154). At this time, the voltage dropped by the discharge resistor 153 is applied to the external connection terminal 101 connected to the output circuit 103, and an external connection circuit (not shown) connected to an input circuit.

However, if the conventional semiconductor integrated circuit device shown in FIG. 9 undergoes an ESD test that is carried out according to the HBM test standards (using the ground voltage Vss as the reference), the capabilities of the NMIS transistor 106 in the electrostatic discharge protection circuit 102 and the NMIS transistor 112 in the output circuit 103 to withstand high voltage might be degraded, and/or the NMIS transistors 106 and 112 might be destroyed.

Furthermore, in order to cut down the cost of an LSI chip, the NMIS transistors 106 and 112 have to be reduced in size. Hence, the capabilities of these transistors to withstand high voltage are more likely to be degraded, and/or these transistors are more likely to be destroyed.

SUMMARY OF THE INVENTION

An object of the present invention is to provide a semiconductor integrated circuit device including an electrostatic discharge protection circuit that is resistant to a surge from outside and has a small area, by implementing means for improving protection against ESD so as to pass a surge test according to HBM test standards.

An inventive semiconductor integrated circuit device includes: an external connection terminal; an electrostatic discharge protection circuit connected to the external connection terminal; a power supply line connected to the electrostatic discharge protection circuit; a ground line connected to the electrostatic discharge protection circuit; and an inter-power supply electrostatic discharge protection circuit that is connected to the power supply line and the ground line, and has a gate insulating element, wherein the inter-power supply electrostatic discharge protection circuit includes a first gate voltage control circuit capable of controlling the gate voltage of the gate insulating element.

Thus, the gate insulating element can be easily turned on by the gate voltage control circuit. Therefore, if a positive surge is applied to the external connection terminal, this surge can be discharged through a path that leads from the electrostatic discharge protection circuit to the ground line via the power supply line and the inter-power supply electrostatic discharge protection circuit. Accordingly, the surge can be discharged through two paths, i.e., this path and another path that leads from the electrostatic discharge protection circuit directly to the ground line. As a result, a larger amount of surge current can be discharged, and degradation in surge resistance can be prevented.

In one embodiment, the gate insulating element may be a first NMIS transistor whose source is connected to the ground line and whose drain is connected to the power supply line, and the first gate voltage control circuit may include: a capacitor whose one end is connected to the power supply line and whose other end is connected to the gate of the first NMIS transistor; and a resistor whose one end is connected to the ground line and whose other end is connected to the gate of the first NMIS transistor.

In such an embodiment, when a positive surge is applied to the external connection terminal, the gate potential of the first NMIS transistor is increased by an RC circuit, made up of the capacitor and the resistor, upon increase of the potential of the power supply line. Therefore, the first NMIS transistor is likely to be turned on. As a result, the surge passes through the electrostatic discharge protection circuit, the power supply line and the first NMIS transistor, and is then discharged to the ground line.

In another embodiment, the gate insulating element may be a first NMIS transistor whose source is connected to the ground line and whose drain is connected to the power supply line, and the first gate voltage control circuit may include: a first inverter section that is connected at its output to the gate of the first NMIS transistor, and has an uneven number of inverters; a resistor whose one end is connected to the power supply line and whose other end is connected to an input of the first inverter section; and a capacitor whose one end is connected to the ground line and whose other end is connected to the input of the first inverter section.

In such an embodiment, when a positive surge is applied to the external connection terminal, the potential of the input of the first inverter section becomes equal to that of the ground line by an RC circuit made up of the capacitor and the resistor. Therefore, a low level signal is inputted to the first inverter section, and a high level signal is outputted therefrom. Consequently, the first NMIS transistor is turned on faster.

In still another embodiment, the gate insulating element may be a first NMIS transistor whose source is connected to the ground line and whose drain is connected to the power supply line, and the first gate voltage control circuit may include: a first inverter section that is connected at its output to the gate of the first NMIS transistor, and has an even number of inverters; a resistor whose one end is connected to the ground line and whose other end is connected to an input of the first inverter section; and a capacitor whose one end is connected to the power supply line and whose other end is connected to the input of the first inverter section.

In such an embodiment, when a positive surge is applied to the external connection terminal, the potential of the input of the first inverter section is increased to be equal to that of the power supply line. Therefore, a high level signal is inputted to the first inverter section, and a high level signal is outputted therefrom. Consequently, the first NMIS transistor is turned on faster.

In still yet another embodiment, the gate insulating element may be a first NMIS transistor whose source is connected to the ground line and whose drain is connected to the power supply line, and the first gate voltage control circuit may include: a first Schmidt trigger circuit connected at its output to the gate of the first NMIS transistor; a resistor whose one end is connected to the power supply line and whose other end is connected to an input of the first Schmidt trigger circuit; and a capacitor whose one end is connected to the ground line and whose other end is connected to the input of the first Schmidt trigger circuit.

In such an embodiment, once the first NMIS transistor has turned on, the turning off of the first NMIS transistor can be delayed due to the hysteresis characteristic of the first Schmidt trigger circuit, and thus the first NMIS transistor can remain in on state for a longer period of time.

In another embodiment, the inter-power supply electrostatic discharge protection circuit may further include: a first PMIS transistor whose source is connected to the power supply line and whose drain is connected to the ground line; and a second gate voltage control circuit capable of controlling the gate voltage of the first PMIS transistor.

In such an embodiment, the first PMIS transistor can be easily turned on by the second gate voltage control circuit. Therefore, when a negative surge is applied to the external connection terminal, this surge can be discharged through a path that leads from the electrostatic discharge protection circuit to the power supply line via the ground line and the inter-power supply electrostatic discharge protection circuit. Accordingly, the surge can be discharged through two paths, i.e., this path and another path that leads from the electrostatic discharge protection circuit directly to the power supply line. As a result, a larger amount of surge current can be discharged, and degradation in surge resistance can be prevented.

In still another embodiment, the second gate voltage control circuit may include: a resistor whose one end is connected to the power supply line and whose other end is connected to the gate of the first PMIS transistor; and a capacitor whose one end is connected to the ground line and whose other end is connected to the gate of the first PMIS transistor.

In such an embodiment, when a negative surge is applied to the external connection terminal, the gate potential of the first PMIS transistor is also reduced upon reduction of the potential of the ground line. Therefore, the first PMIS transistor is likely to be turned on. Thus, the surge passes through the electrostatic discharge protection circuit, the ground line and the first PMIS transistor, and is then discharged to the power supply line.

In still yet another embodiment, the second gate voltage control circuit may include: a second inverter section that is connected at its output to the gate of the first PMIS transistor, and has an uneven number of inverters; a capacitor whose one end is connected to the power supply line and whose other end is connected to an input of the second inverter section; and a resistor whose one end is connected to the ground line and whose other end is connected to the input of the second inverter section.

In such an embodiment, when a negative surge is applied to the external connection terminal, the potential of the input of the second inverter section becomes higher than that of the ground line by an RC circuit made up of the capacitor and the resistor. Therefore, a high level signal is inputted to the second inverter section, and a low level signal is outputted therefrom. Consequently, the first PMIS transistor is turned on faster.

In another embodiment, the second gate voltage control circuit may include: a second inverter section that is connected at its output to the gate of the first PMIS transistor, and has an even number of inverters; a capacitor whose one end is connected to the ground line and whose other end is connected to an input of the second inverter section; and a resistor whose one end is connected to the power supply line and whose other end is connected to the input of the second inverter section.

In such an embodiment, when a negative surge is applied to the external connection terminal, the potential of the input of the second inverter section is reduced to be equal to that of the ground line. Therefore, a low level signal is inputted to the second inverter section, and a low level signal is outputted therefrom. Consequently, the first PMIS transistor is turned on faster.

In still another embodiment, the second gate voltage control circuit may include: a second Schmidt trigger circuit connected at its output to the gate of the first PMIS transistor; a capacitor whose one end is connected to the power supply line and whose other end is connected to an input of the second Schmidt trigger circuit; and a resistor whose one end is connected to the ground line and whose other end is connected to the input of the second Schmidt trigger circuit.

In such an embodiment, when a negative surge is applied to the external connection terminal, the potential of the ground line is reduced, and then the surge outputted from the second Schmidt trigger circuit has a waveform gentler than that of the surge inputted thereto. Therefore, once the first PMIS transistor has turned on, the turning off of the first PMIS transistor can be delayed, and thus the first PMIS transistor can remain in on state for a longer period of time.

In still yet another embodiment, the inventive semiconductor integrated circuit device may further include an input buffer circuit connected to the external connection terminal.

In another embodiment, the inventive semiconductor integrated circuit device may further include: an output circuit connected to the external connection terminal; and an output prebuffer circuit connected to the output circuit.

In still another embodiment, the output prebuffer circuit may include a first prebuffer circuit having at its last stage a first prebuffer connected to the power supply line, and a second prebuffer circuit having at its last stage a second prebuffer connected to the power supply line, and the output circuit may include: a second PMIS transistor whose source is connected to the power supply line, whose drain is connected to the external connection terminal, whose gate is connected to an output terminal of the first prebuffer, and whose n-type substrate region is connected to the power supply line; and a second NMIS transistor whose source is connected to the ground line, whose drain is connected to the external connection terminal, whose gate is connected to an output terminal of the second prebuffer, and whose p-type substrate region is connected to the ground line.

In still yet another embodiment, the inventive semiconductor integrated circuit device may further include an internal circuit connected to the external connection terminal.

In another embodiment, the electrostatic discharge protection circuit may include: a third PMIS transistor whose source is connected to the power supply line, whose drain is connected to the external connection terminal, and whose n-type substrate region is connected to the power supply line; and a third NMIS transistor whose source is connected to the ground line, whose drain is connected to the external connection terminal, and whose p-type substrate region is connected to the ground line.

In still another embodiment, the inventive semiconductor integrated circuit device may further include: a resistor interposed between the gate of the third PMIS transistor and the power supply line; and a resistor interposed between the gate of the third NMIS transistor and the ground line.

In still yet another embodiment, the electrostatic discharge protection circuit may include: a first PN diode whose one end is connected to the power supply line and whose other end is connected to the external connection terminal; and a second PN diode whose one end is connected to the ground line and whose other end is connected to the external connection terminal.

DESCRIPTION OF THE PREFERRED EMBODIMENTS

Examination

Figure 1:
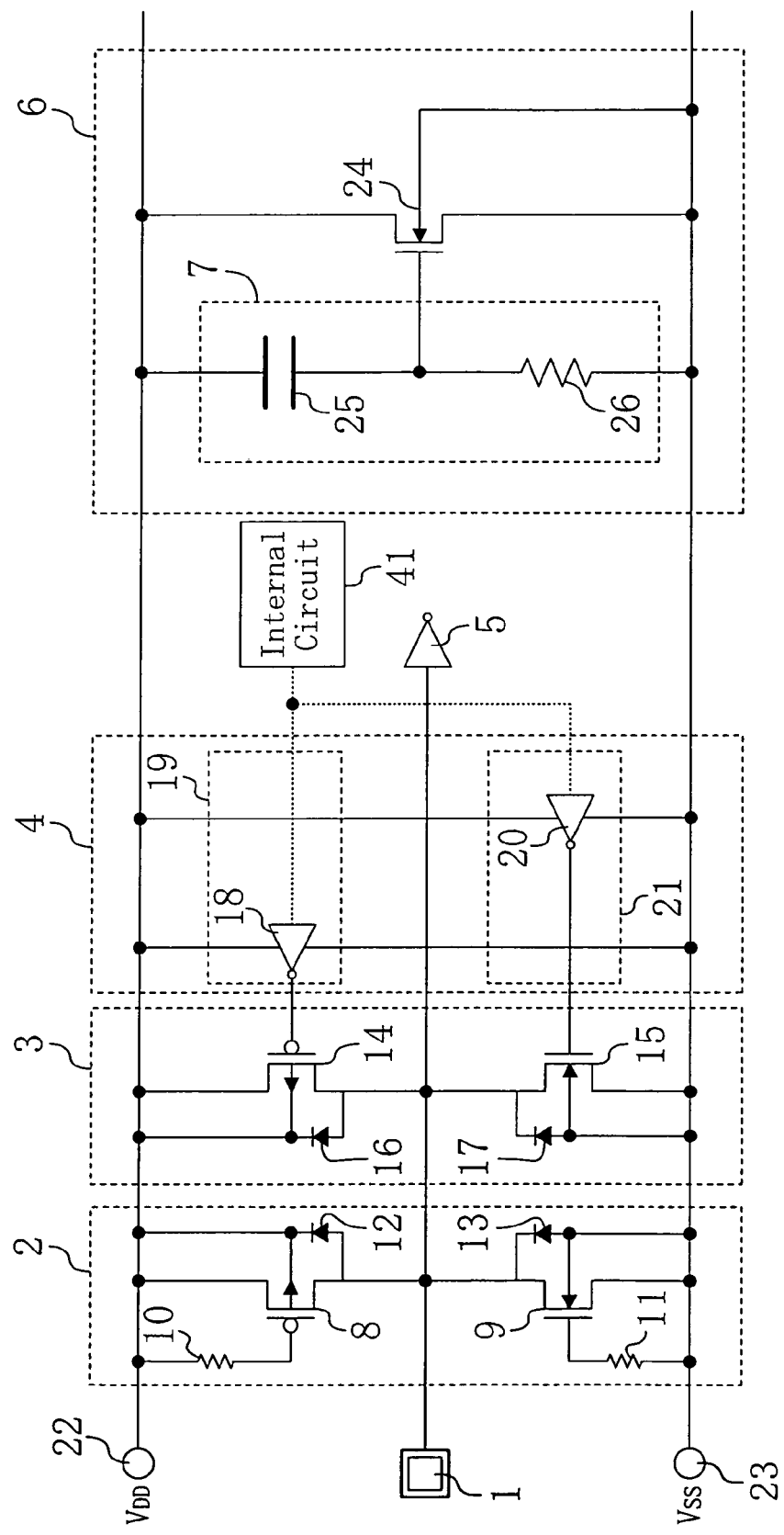
FIG. 1 is a circuit diagram illustrating the configuration of a semiconductor integrated circuit device including an electrostatic discharge protection circuit according to a first embodiment of the present invention.

The present inventors examined the reasons why the NMIS transistors 106 and 112 are destroyed and/or the capabilities of the transistors to withstand high voltage are degraded as follows.

In the status in which the power supply line 119 is placed in an open state and the voltage of the ground line 120 is fixed at the ground voltage Vss, there are two kinds of discharge paths for surge current if a positive electrical charge is applied to the external connection terminal 101. A first path sequentially passes through the external connection terminal 101, a parasitic forward diode 109 (i.e., the pn junction between the drain region and the substrate region of the PMIS transistor 105), a parasitic forward diode 113 (i.e., the pn junction between the drain region and the substrate region of the PMIS transistor 111), the power supply line 119, the NMIS transistor 123 of the inter-power supply electrostatic discharge protection circuit 122, and the ground line 120. On the other hand, a second path sequentially passes through the external connection terminal 101, the NMIS transistor 106 of the electrostatic discharge protection circuit 102, the NMIS transistor 112 of the output circuit 103, and the ground line 120.

In this case, the power supply line 119 is connected to the external connection terminal 101 via the parasitic diodes 109 and 113. If the potential of the external connection terminal 101 is denoted by Vpad and the total of built-in voltages of the parasitic diodes 109 and 113 is denoted by Vbiv, the potential of the power supply line 119 is denoted by Vpad-Vbiv.

The potential Vpad of the external connection terminal 101 in this case is determined by the snapback characteristics of the NMIS transistors 106 and 112. Since the potential of the power supply line 119 is reduced by the built-in voltages Vbiv of the parasitic diodes 109 and 113 and is thus represented by the expression Vpad-Vbiv, the breakdown voltage of the inter-power supply electrostatic discharge protection circuit 122 is unlikely to be reached. Therefore, the NMIS transistor 123 within the inter-power supply electrostatic discharge protection circuit 122 remains in off state and is unlikely to be turned on.

Accordingly, when a positive electrical charge is applied to the external connection terminal 101, the above-described first path is unlikely to be brought into conduction, and thus the second path is often selected. That is, only the path passing through the external connection terminal 101, the NMIS transistor 106 of the electrostatic discharge protection circuit 102, the NMIS transistor 112 of the output circuit 103, and the ground line 120 is selected, which undesirably degrades the capabilities of these transistors to withstand high voltage.

First Embodiment

Hereinafter, a first embodiment of the present invention will be described with reference to the drawings. FIG. 1 is a circuit diagram illustrating the configuration of a semiconductor integrated circuit device including an electrostatic discharge protection circuit according to the first embodiment. To be more specific, FIG. 1 illustrates the configuration of an input/output section of the semiconductor integrated circuit device, and the periphery of the input/output section.

As shown in FIG. 1, the semiconductor integrated circuit device of the present embodiment includes: an external connection terminal 1; an electrostatic discharge protection circuit 2; an output circuit 3; an output prebuffer circuit 4; an input buffer circuit 5; an internal circuit 41; and an inter-power supply electrostatic discharge protection circuit 6. The electrostatic discharge protection circuit 2 and the inter-power supply electrostatic discharge protection circuit 6 are provided in order to protect the output circuit 3, the internal circuit 41 and the input buffer circuit 5 from a surge penetrated from the external connection terminal 1. The present embodiment is characterized in that a gate voltage control circuit 7 is provided in the inter-power supply electrostatic discharge protection circuit 6. By providing the gate voltage control circuit 7, it becomes possible to control the gate voltage of an NMIS transistor 24 in the inter-power supply electrostatic discharge protection circuit 6 during an ESD test.

The electrostatic discharge protection circuit 2 is provided between the external connection terminal 1 and the output circuit 3, and has: a PMIS transistor 8; an NMIS transistor 9; a resistor 10; and a resistor 11. The PMIS transistor 8 has: a source connected to a power supply line 22 through which a power supply voltage $V_{DD}$ is supplied; a gate connected to the power supply line 22 with the resistor 10 interposed therebetween; a drain connected to the external connection terminal 1; and a substrate region (n-well) connected to the power supply line 22. On the other hand, the NMIS transistor 9 has: a source connected to a ground line 23; a gate connected to the ground line 23 with the resistor 11 interposed therebetween; a drain connected to the external connection terminal 1; and a substrate region (p-well) connected to the ground line 23.

The output circuit 3 is provided between the electrostatic discharge protection circuit 2 and the output prebuffer circuit 4, and has a PMIS transistor 14 and an NMIS transistor 15. The PMIS transistor 14 has: a source connected to the power supply line 22; a gate connected to an output terminal of a prebuffer 18 of the output prebuffer circuit 4; a drain connected to the external connection terminal 1; and a substrate region (n-well) connected to the power supply line 22. On the other hand, the NMIS transistor 15 has: a source connected to the ground line 23; a gate connected to an output terminal of a prebuffer 20 of the output prebuffer circuit 4; a drain connected to the external connection terminal 1; and a substrate region (p-well) connected to the ground line 23.

The output prebuffer circuit 4 serves to amplify an output signal from the internal circuit 41, and is provided between the internal circuit 41 and the output circuit 3. The output prebuffer circuit 4 has: a prebuffer circuit 19 provided at its last stage with the prebuffer 18; and a prebuffer circuit 21 provided at its last stage with the prebuffer 20. The prebuffer 18 is provided with: a terminal which is connected to the power supply line 22 and through which a power supply voltage is supplied; a ground terminal connected to the ground line 23; an output terminal connected to the gate of the PMIS transistor 14 of the output circuit 3; and an input terminal connected to the internal circuit 41. On the other hand, the prebuffer 20 is provided with: a terminal which is connected to the power supply line 22 and through which a power supply voltage is supplied; a ground terminal connected to the ground line 23; an output terminal connected to the gate of the NMIS transistor 15 of the output circuit 3; and an input terminal connected to the internal circuit 41. It should be noted that, although not shown, the prebuffer circuits 19 and 21 are each provided with prebuffers whose number is determined in accordance with the degree of amplification of an output signal from the internal circuit 41. Output signals whose levels are identical or opposite to each other are sent from the output terminal of the prebuffer 18 at the last stage of the prebuffer circuit 19 and that of the prebuffer 20 at the last stage of the prebuffer circuit 21.

An input section of the input buffer circuit 5 is connected to the external connection terminal 1, while an output section of the input buffer circuit 5 is connected to the internal circuit 41 and/or other internal circuit (not shown).

The inter-power supply electrostatic discharge protection circuit 6 is provided between the power supply line 22 and the ground line 23, and has the NMIS transistor 24 and the gate voltage control circuit 7. The NMIS transistor 24 has: a source connected to the ground line 23; a drain connected to the power supply line 22 through which the power supply voltage $V_{DD}$ is supplied; a gate connected to an output terminal of the gate voltage control circuit 7; and a substrate region (p-well) connected to the ground line 23.

The gate voltage control circuit 7 is provided between the power supply line 22 and the ground line 23, and has a capacitor 25 and a resistor 26. An end of the capacitor 25 is connected to the power supply line 22 through which the power supply voltage $V_{DD}$ is supplied, while the other end of the capacitor 25 is connected to the gate of the NMIS transistor 24. On the other hand, an end of the resistor 26 is connected to the ground line 23 through which a ground voltage Vss is supplied, while the other end of the resistor 26 is connected to the gate of the NMIS transistor 24. In the present invention, instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

Figure 10A:
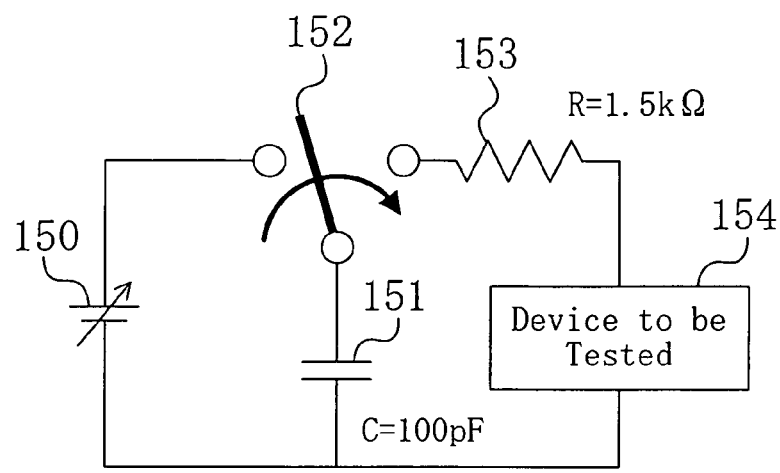
FIGS. 10A and 10B are a circuit diagram illustrating an evaluation circuit for carrying out an ESD test according to HBM test standards, and a graph showing the waveform of surge current passed through the evaluation circuit in carrying out the test according to the HBM test standards, respectively.
Figure 10B:
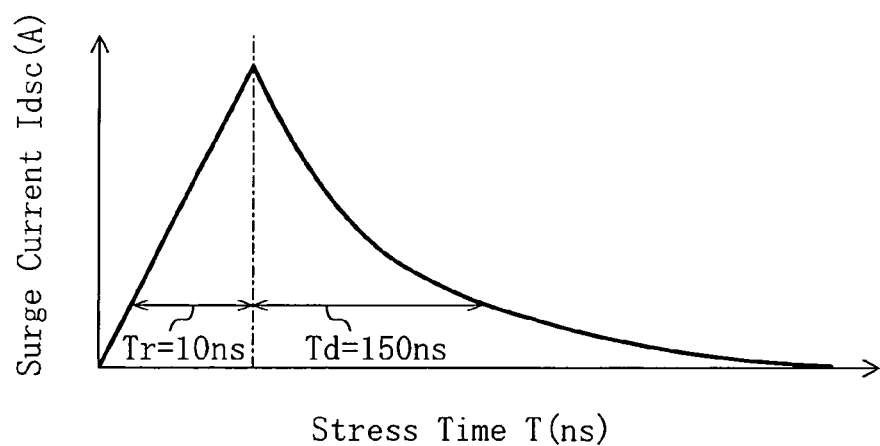

Next, an operation of the above-described semiconductor integrated circuit device during an ESD test will be described with reference to FIGS. 10A and 10B again.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn junction between the drain region and the substrate region (n-well) of the PMIS transistor 8 serves as a parasitic forward diode 12, and the pn junction between the drain region and the substrate region (n-well) of the PMIS transistor 14 serves as a parasitic forward diode 16. On the other hand, in the path leading from the external connection terminal 1 to the ground line 23, the pn junction between the drain region and the substrate region (p-well) of the NMIS transistor 9 serves as a parasitic backward diode 13, and the pn junction between the drain region and the substrate region (p-well) of the NMIS transistor 15 serves as a parasitic backward diode 17.

A positive surge applied to the external connection terminal 1 flows into the power supply line 22 through the parasitic forward diodes 12 and 16, and the potential of the power supply line 22 is increased. In the present embodiment, the capacitor 25 is connected between the power supply line 22 and the gate of the NMIS transistor 24. Further, the resistor 26 is provided between the ground line 23 and the NMIS transistor 24. Thus, if the potential of the power supply line 22 is increased, the gate potential of the NMIS transistor 24 is also increased by an RC circuit including the capacitor 25 and the resistor 26. Therefore, the NMIS transistor 24 is likely to be turned on. If the NMIS transistor 24 is turned on, the positive electrical charge supplied to the external connection terminal 1 is discharged toward the ground line 23. In this case, the NMIS transistor 24 contributes to this discharge also as a parasitic bipolar transistor.

If surge current cannot be discharged by using only the above-described path, the NMIS transistors 9 and 15 are turned on as soon as the breakdown voltages of the NMIS transistors 9 and 15 are reached. Thus, surge current sequentially passes through the external connection terminal 1, the NMIS transistors 9 and 15, and the ground line 23.

As described above, the semiconductor integrated circuit device of the present embodiment can have two discharge paths for surge current. As a result, a larger amount of surge current can be discharged, and degradation in surge resistance can be prevented.

Second Embodiment

Figure 2:
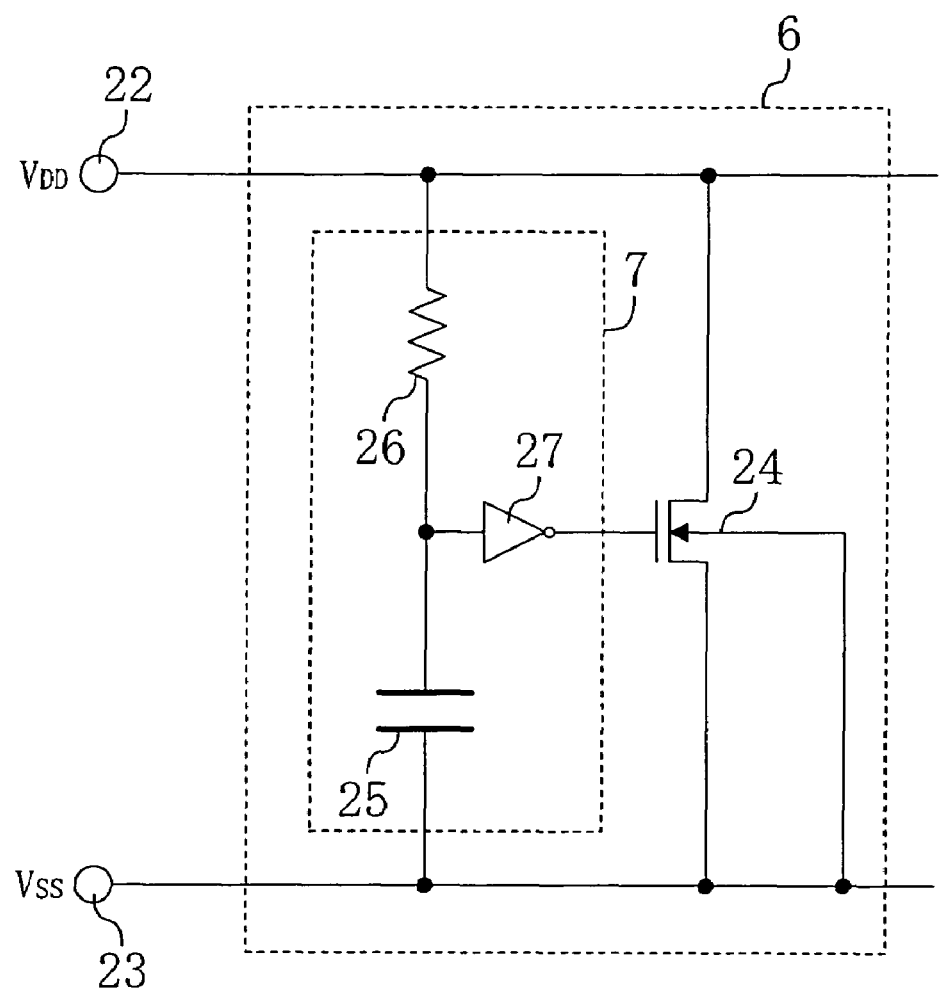
FIG. 2 is a circuit diagram illustrating the configuration of an inter-power supply electrostatic discharge protection circuit of a semiconductor integrated circuit device according to a second embodiment of the present invention.

Hereinafter, a second embodiment of the present invention will be described with reference to the drawings. The semiconductor integrated circuit device of the second embodiment is similar in configuration to that of the first embodiment except an inter-power supply electrostatic discharge protection circuit, and therefore, the inter-power supply electrostatic discharge protection circuit will be mainly described below. FIG. 2 is a circuit diagram illustrating the configuration of the inter-power supply electrostatic discharge protection circuit 6 of the semiconductor integrated circuit device according to the second embodiment.

As shown in FIG. 2, the inter-power supply electrostatic discharge protection circuit 6 of the present embodiment is provided between a power supply line 22 and a ground line 23, and has an NMIS transistor 24 and a gate voltage control circuit 7. The NMIS transistor 24 has: a source connected to the ground line 23; a drain connected to the power supply line 22 through which a power supply voltage $V_{DD}$ is supplied; and a gate connected to an output terminal of the gate voltage control circuit 7.

The gate voltage control circuit 7 is provided between the power supply line 22 and the ground line 23, and has a capacitor 25, a resistor 26 and an inverter 27. An end of the resistor 26 is connected to the power supply line 22 through which the power supply voltage $V_{DD}$ is supplied, while the other end of the resistor 26 is connected to an input terminal of the inverter 27. On the other hand, an end of the capacitor 25 is connected to the ground line 23 through which a ground voltage Vss is supplied, while the other end of the capacitor 25 is connected to the input terminal of the inverter 27. An output terminal of the inverter 27 is connected to the gate of the NMIS transistor 24. In the present invention, instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

Next, an operation of the above-described semiconductor integrated circuit device during an ESD test will be described with reference to FIGS. 10A and 10B again. Since the semiconductor integrated circuit device of the second embodiment is similar in configuration to the semiconductor integrated circuit device shown in FIG. 1 except the inter-power supply electrostatic discharge protection circuit 6, the description will be made also with reference to FIG. 1.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn junction between the drain region and the substrate region (n-well) of the PMIS transistor 8 serves as the parasitic forward diode 12, and the pn junction between the drain region and the substrate region (n-well) of the PMIS transistor 14 serves as the parasitic forward diode 16. On the other hand, in the path leading from the external connection terminal 1 to the ground line 23, the pn junction between the drain region and the substrate region (p-well) of the NMIS transistor 9 serves as the parasitic backward diode 13, and the pn junction between the drain region and the substrate region (p-well) of the NMIS transistor 15 serves as the parasitic backward diode 17.

A positive electrical charge applied to the external connection terminal 1 flows into the power supply line 22 through the parasitic forward diodes 12 and 16, and the potential of the power supply line 22 is increased. In the present embodiment, as shown in FIG. 2, the resistor 26 and the inverter 27 are connected between the power supply line 22 and the gate of the NMIS transistor 24. Since the resistor 26 is provided, the potential of the input section of the inverter 27 becomes lower than that of the power supply line 22. Therefore, a low level signal is inputted to the inverter 27, and a high level signal corresponding to the potential of the power supply line 22 is outputted from the inverter 27. Accordingly, the NMIS transistor 24 in the inter-power supply electrostatic discharge protection circuit 6 is quickly turned on. In this case, if a low level signal has reached the inverter 27, a high level signal is immediately outputted from the inverter 27, and therefore, the NMIS transistor 24 can be turned on faster. If the NMIS transistor 24 is turned on, the positive electrical charge supplied to the external connection terminal 1 is discharged toward the ground line 23. The NMIS transistor 24 contributes to this discharge also as a parasitic bipolar transistor. Since the capacitor 25 is provided between the input section of the inverter 27 and the ground line 23, the NMIS transistor 24 is prevented from turning on during normal operation.

If surge current cannot be discharged by using only the above-described path, the NMIS transistors 9 and 15 are turned on as soon as the breakdown voltages of the NMIS transistors 9 and 15 are reached. Thus, surge current sequentially passes through the external connection terminal 1, the NMIS transistors 9 and 15, and the ground line 23.

As described above, the semiconductor integrated circuit device of the present embodiment can have two discharge paths for surge current. As a result, a larger amount of surge current can be discharged, and degradation in surge resistance can be prevented.

The present embodiment has been described on the supposition that one inverter 27 is provided. Alternatively, a plurality of inverters (e.g., an uneven number of inverters) may be provided in the present embodiment. Optionally, an even number of inverters may be provided. In such a case, it is sufficient to reverse the position of the resistor 26 and that of the capacitor 25 in the above-described structure. If a plurality of inverters are provided in this manner, the NMIS transistor 24 can be turned on even faster.

Third Embodiment

Figure 3:
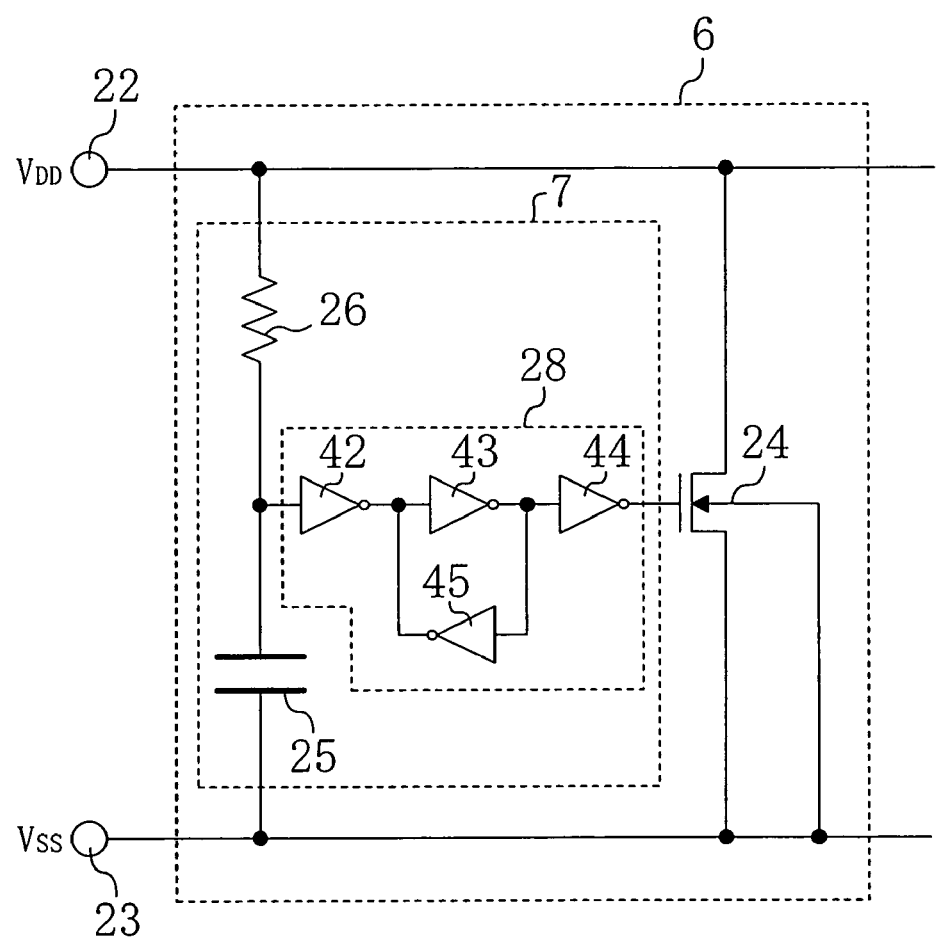
FIG. 3 is a circuit diagram illustrating the configuration of an inter-power supply electrostatic discharge protection circuit of a semiconductor integrated circuit device according to a third embodiment of the present invention.

Hereinafter, a third embodiment of the present invention will be described with reference to the drawings. The semiconductor integrated circuit device of the third embodiment is similar in configuration to that of the first embodiment except an inter-power supply electrostatic discharge protection circuit, and therefore, the inter-power supply electrostatic discharge protection circuit will be mainly described below. FIG. 3 is a circuit diagram illustrating the configuration of the inter-power supply electrostatic discharge protection circuit 6 of the semiconductor integrated circuit device according to the third embodiment.

As shown in FIG. 3, the inter-power supply electrostatic discharge protection circuit 6 of the present embodiment is provided between a power supply line 22 and a ground line 23, and has an NMIS transistor 24 and a gate voltage control circuit 7. The NMIS transistor 24 has: a source connected to the ground line 23 through which a ground voltage Vss is supplied; a drain connected to the power supply line 22 through which a power supply voltage $V_{DD}$ is supplied; and a gate connected to an output terminal of the gate voltage control circuit 7.

The gate voltage control circuit 7 is provided between the power supply line 22 and the ground line 23, and has a capacitor 25, a resistor 26 and a Schmidt trigger circuit 28. An end of the capacitor 25 is connected to the ground line 23 through which the ground voltage Vss is supplied, while the other end of the capacitor 25 is connected to an input terminal of the Schmidt trigger circuit 28. On the other hand, an end of the resistor 26 is connected to the power supply line 22 through which the power supply voltage $V_{DD}$ is supplied, while the other end of the resistor 26 is connected to the input terminal of the Schmidt trigger circuit 28. An output terminal of the Schmidt trigger circuit 28 is connected to the gate of the NMIS transistor 24. In this case, instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

In the Schmidt trigger circuit 28, inverters 42, 43 and 44 are connected in series, and an inverter 45 is connected so as to return an output from the inverter 43. The inverters 43 and 45 constitute a latch circuit. The configuration of the Schmidt trigger circuit 28 is shown by way of example. In the present invention, other circuit that is configured differently and exhibits hysteresis characteristic may alternatively be used.

Next, an operation of the above-described semiconductor integrated circuit device during an ESD test will be described with reference to FIGS. 10A and 10B again. Since the semiconductor integrated circuit device of the third embodiment is similar in configuration to the semiconductor integrated circuit device shown in FIG. 1 except the inter-power supply electrostatic discharge protection circuit 6, the description will be made also with reference to FIG. 1.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn junction between the drain region and the substrate region (n-well) of the PMIS transistor 8 serves as the parasitic forward diode 12, and the pn junction between the drain region and the substrate region (n-well) of the PMIS transistor 14 serves as the parasitic forward diode 16. On the other hand, in the path leading from the external connection terminal 1 to the ground line 23, the pn junction between the drain region and the substrate region (p-well) of the NMIS transistor 9 serves as the parasitic backward diode 13, and the pn junction between the drain region and the substrate region (p-well) of the NMIS transistor 15 serves as the parasitic backward diode 17.

A positive surge applied to the external connection terminal 1 flows into the power supply line 22 through the parasitic forward diodes 12 and 16, and the potential of the power supply line 22 is increased. In the present embodiment, as shown in FIG. 3, the resistor 26 and the Schmidt trigger circuit 28 are connected between the power supply line 22 and the gate of the NMIS transistor 24. Since the Schmidt trigger circuit 28 exhibits hysteresis characteristic, once the NMIS transistor 24 has turned on, the turning off of the NMIS transistor 24 can be delayed. Therefore, the NMIS transistor 24 can remain in on state for a longer period of time.

Besides, since the Schmidt trigger circuit 28 is provided, the resistance of the resistor 26 can be reduced. Accordingly, during normal operation, current consumption in the inter-power supply electrostatic discharge protection circuit 6 can be kept at a low level.

Fourth Embodiment

Figure 4:
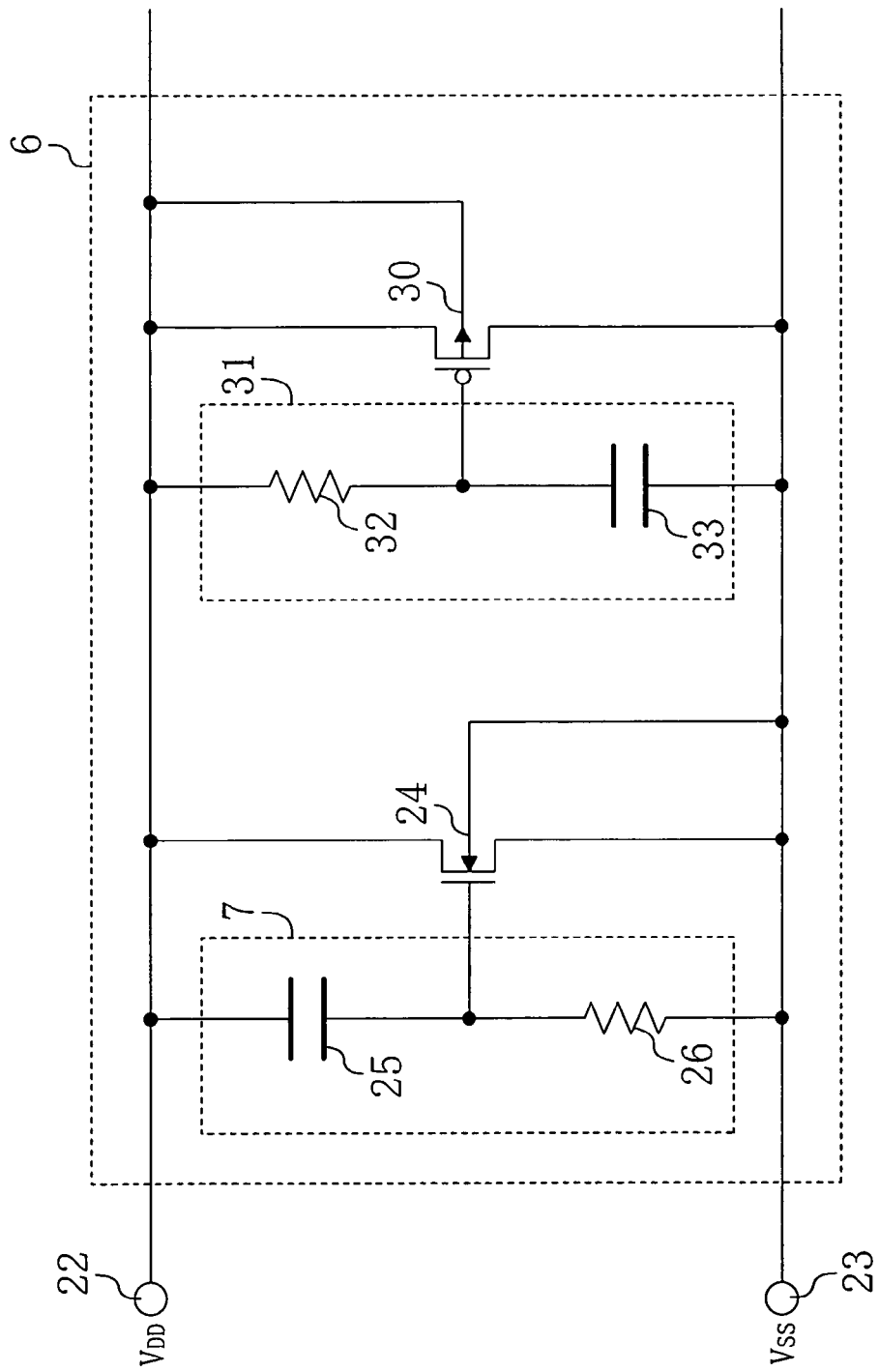
FIG. 4 is a circuit diagram illustrating the configuration of an inter-power supply electrostatic discharge protection circuit of a semiconductor integrated circuit device according to a fourth embodiment of the present invention.

Hereinafter, a fourth embodiment of the present invention will be described with reference to the drawings. The semiconductor integrated circuit device of the fourth embodiment is similar in configuration to that of the first embodiment except an inter-power supply electrostatic discharge protection circuit, and therefore, the inter-power supply electrostatic discharge protection circuit will be mainly described below. FIG. 4 is a circuit diagram illustrating the configuration of the inter-power supply electrostatic discharge protection circuit 6 of the semiconductor integrated circuit device according to the fourth embodiment.

As shown in FIG. 4, the inter-power supply electrostatic discharge protection circuit 6 of the present embodiment is provided between a power supply line 22 and a ground line 23, and has an NMIS transistor 24, a PMIS transistor 30, and gate voltage control circuits 7 and 31. The NMIS transistor 24 has: a source connected to the ground line 23 through which a ground voltage Vss is supplied; a drain connected to the power supply line 22 through which a power supply voltage $V_{DD}$ is supplied; and a gate connected to an output terminal of the gate voltage control circuit 7. On the other hand, the PMIS transistor 30 has: a drain connected to the ground line 23 through which the ground voltage Vss is supplied; a source connected to the power supply line 22 through which the power supply voltage $V_{DD}$ is supplied; and a gate connected to an output terminal of the gate voltage control circuit 31.

The gate voltage control circuit 7 is provided between the power supply line 22 and the ground line 23, and has a capacitor 25 and a resistor 26. An end of the capacitor 25 is connected to the power supply line 22 through which the power supply voltage $V_{DD}$ is supplied, while the other end of the capacitor 25 is connected to the output terminal of the gate voltage control circuit 7. On the other hand, an end of the resistor 26 is connected to the ground line 23 through which the ground voltage Vss is supplied, while the other end of the resistor 26 is connected to the output terminal of the gate voltage control circuit 7. Instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

The gate voltage control circuit 31 is provided between the power supply line 22 and the ground line 23, and has a capacitor 33 and a resistor 32. An end of the resistor 32 is connected to the power supply line 22 through which the power supply voltage $V_{DD}$ is supplied, while the other end of the resistor 32 is connected to the output terminal of the gate voltage control circuit 31. On the other hand, an end of the capacitor 33 is connected to the ground line 23 through which the ground voltage Vss is supplied, while the other end of the capacitor 33 is connected to the output terminal of the gate voltage control circuit 31. Instead of the capacitor 33, wiring capacitance, gate capacitance, junction capacitance or the like may alternatively be utilized. Furthermore, instead of the resistor 32, wiring resistance, gate resistance, transistor resistance or the like may alternatively be utilized.

Next, an operation of the above-described semiconductor integrated circuit device during an ESD test will be described with reference to FIGS. 10A and 10B again. Since the semiconductor integrated circuit device of the fourth embodiment is similar in configuration to the semiconductor integrated circuit device shown in FIG. 1 except the inter-power supply electrostatic discharge protection circuit 6, the description will be made also with reference to FIG. 1.

In carrying out the ESD test, there is the case where the power supply line 22 is placed in an open state and the voltage of the ground line 23 is fixed at the voltage Vss as described in the first through third embodiments, and there is also the opposite case, i.e., the case where the voltage of the power supply line 22 is fixed at the voltage $V_{DD}$ and the ground line 23 is placed in an open state. The semiconductor integrated circuit device of the present embodiment is adaptable to both the cases. A specific description will be made about this below.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the first embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage $V_{DD}$.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (n-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is decreased. In the present embodiment, as shown in FIG. 4, the capacitor 33 is connected between the ground line 23 and the gate of the PMIS transistor 30. Further, the resistor 32 is provided between the power supply line 22 and the PMIS transistor 30. Thus, when the potential of the ground line 23 is decreased, the gate potential of the PMIS transistor 30 is also decreased. Therefore, the PMIS transistor 30 is likely to be turned on. If the PMIS transistor 30 is turned on, the negative electrical charge supplied to the external connection terminal 1 is discharged to the power supply line 22. In this case, the PMIS transistor 30 contributes to this discharge also as a parasitic bipolar transistor.

If surge current cannot be discharged by using only the above-described path, the PMIS transistors 8 and 14 are turned on as soon as the potential of the ground line 23 is decreased and the breakdown voltages of the PMIS transistors 8 and 14 are reached. Thus, surge current sequentially passes through the external connection terminal 1, the PMIS transistor 8 of the electrostatic discharge protection circuit 2, the PMIS transistor 14 of the output circuit 3, and the power supply line 22.

As described above, the semiconductor integrated circuit device of the present embodiment can have two discharge paths for surge current even if a positive or negative electrical charge is applied to the external connection terminal 1. As a result, a larger amount of surge current can be discharged, and degradation in surge resistance can be prevented.

Fifth Embodiment

Figure 5:
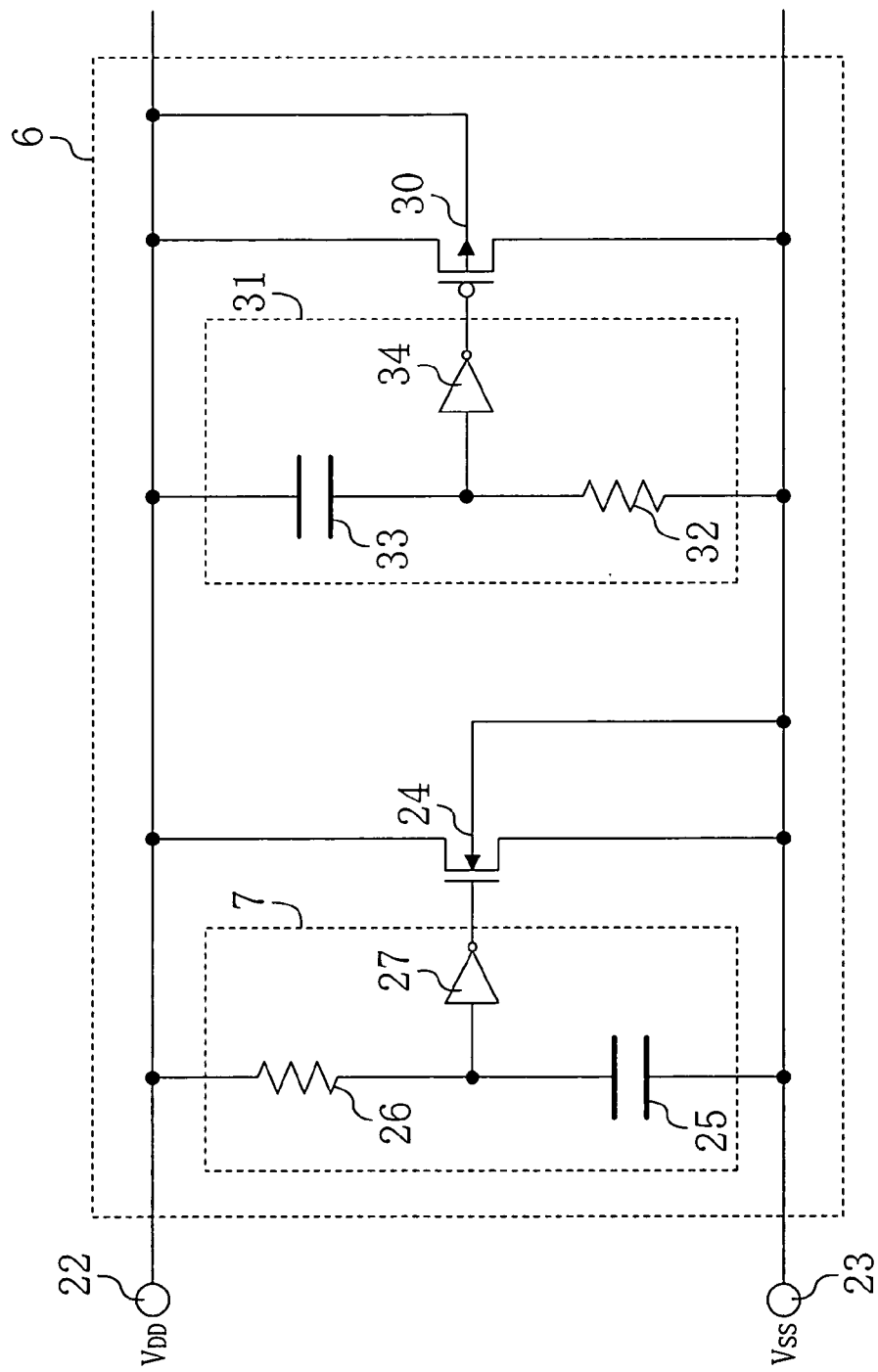
FIG. 5 is a circuit diagram illustrating the configuration of an inter-power supply electrostatic discharge protection circuit of a semiconductor integrated circuit device according to a fifth embodiment of the present invention.

Hereinafter, a fifth embodiment of the present invention will be described with reference to the drawings. The semiconductor integrated circuit device of the fifth embodiment is similar in configuration to that of the first embodiment except an inter-power supply electrostatic discharge protection circuit, and therefore, the inter-power supply electrostatic discharge protection circuit will be mainly described below. FIG. 5 is a circuit diagram illustrating the configuration of the inter-power supply electrostatic discharge protection circuit 6 of the semiconductor integrated circuit device according to the fifth embodiment.

As shown in FIG. 5, the inter-power supply electrostatic discharge protection circuit 6 of the present embodiment is provided between a power supply line 22 and a ground line 23, and has an NMIS transistor 24, a PMIS transistor 30, and gate voltage control circuits 7 and 31. The NMIS transistor 24 has: a source connected to the ground line 23 through which a ground voltage Vss is supplied; a drain connected to the power supply line 22 through which a power supply voltage $V_{DD}$ is supplied; and a gate connected to an output terminal of the gate voltage control circuit 7. On the other hand, the PMIS transistor 30 has: a drain connected to the ground line 23 through which the ground voltage Vss is supplied; a source connected to the power supply line 22 through which the power supply voltage $V_{DD}$ is supplied; and a gate connected to an output terminal of the gate voltage control circuit 31.

The gate voltage control circuit 7 is provided between the power supply line 22 and the ground line 23, and has a capacitor 25, a resistor 26 and an inverter 27. An end of the resistor 26 is connected to the power supply line 22 through which the power supply voltage $V_{DD}$ is supplied, while the other end of the resistor 26 is connected to an input terminal of the inverter 27.

On the other hand, an end of the capacitor 25 is connected to the ground line 23 through which the ground voltage Vss is supplied, while the other end of the capacitor 25 is connected to the input terminal of the inverter 27. An output terminal of the inverter 27 is connected to the gate of the NMIS transistor 24. Instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

The gate voltage control circuit 31 is provided between the power supply line 22 and the ground line 23, and has a resistor 32, a capacitor 33 and an inverter 34. An end of the capacitor 33 is connected to the power supply line 22 through which the power supply voltage $V_{DD}$ is supplied, while the other end of the capacitor 33 is connected to an input terminal of the inverter 34. On the other hand, an end of the resistor 32 is connected to the ground line 23 through which the ground voltage Vss is supplied, while the other end of the resistor 32 is connected to the input terminal of the inverter 34. An output terminal of the inverter 34 is connected to the gate of the PMIS transistor 30. Instead of the capacitor 33, wiring capacitance, gate capacitance, junction capacitance or the like may alternatively be utilized. Furthermore, instead of the resistor 32, wiring resistance, gate resistance, transistor resistance or the like may alternatively be utilized.

Next, an operation of the above-described semiconductor integrated circuit device during an ESD test will be described with reference to FIGS. 10A and 10B again. Since the semiconductor integrated circuit device of the fifth embodiment is similar in configuration to the semiconductor integrated circuit device shown in FIG. 1 except the inter-power supply electrostatic discharge protection circuit 6, the description will be made also with reference to FIG. 1.

The semiconductor integrated circuit device of the fifth embodiment is adaptable to the case where the power supply line 22 is placed in an open state and the voltage of the ground line 23 is fixed at the voltage Vss as in the fourth embodiment, and is also adaptable to the case where the voltage of the power supply line 22 is fixed at the voltage $V_{DD}$ and the ground line 23 is placed in an open state. A specific description will be made about this below.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the second embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage $V_{DD}$.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (n-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is decreased. In the present embodiment, as shown in FIG. 5, the resistor 32 and the inverter 34 are connected between the ground line 23 and the gate of the PMIS transistor 30. Since the resistor 32 is provided, the potential of the input section of the inverter 34 becomes higher than that of the ground line 23. Thus, a high level signal is inputted to the inverter 34, and a low level signal corresponding to the potential of the ground line 23 is outputted from the inverter 34. Accordingly, the PMIS transistor 30 is likely to be turned on. If the PMIS transistor 30 is turned on, the negative electrical charge supplied to the external connection terminal 1 is discharged to the power supply line 22. In this case, the PMIS transistor 30 contributes to this discharge also as a parasitic bipolar transistor.

If surge current cannot be discharged by using only the above-described path, the PMIS transistors 8 and 14 are turned on as soon as the potential of the ground line 23 is decreased and the breakdown voltages of the PMIS transistors 8 and 14 are reached. Thus, surge current sequentially passes through the external connection terminal 1, the PMIS transistor 8 of the electrostatic discharge protection circuit 2, the PMIS transistor 14 of the output circuit 3, and the power supply line 22.

As described above, the semiconductor integrated circuit device of the present embodiment can have two discharge paths for surge current even if a positive or negative electrical charge is applied to the external connection terminal 1. As a result, a larger amount of surge current can be discharged, and degradation in surge resistance can be prevented.

Sixth Embodiment

Figure 6:
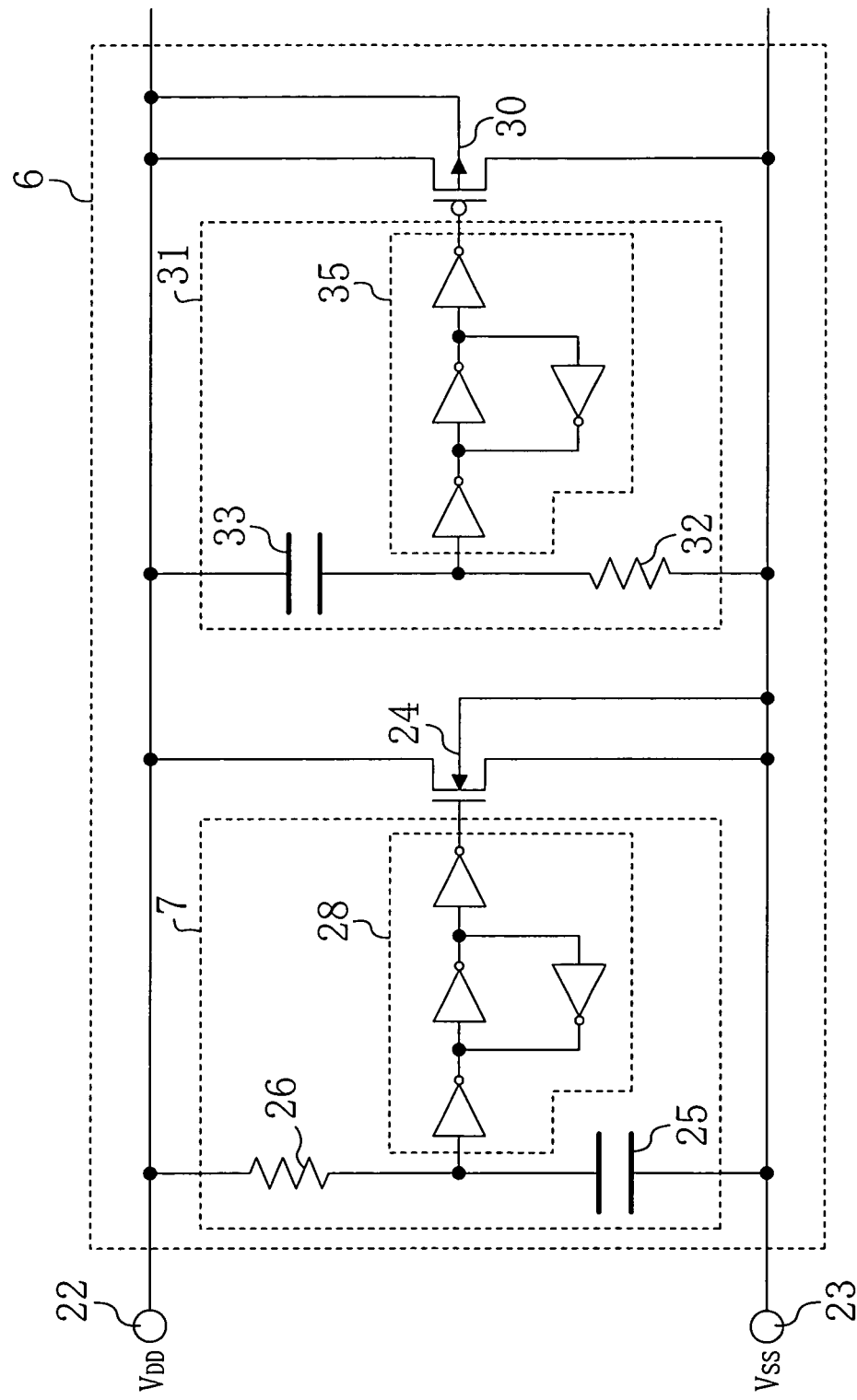
FIG. 6 is a circuit diagram illustrating the configuration of an inter-power supply electrostatic discharge protection circuit of a semiconductor integrated circuit device according to a sixth embodiment of the present invention.

Hereinafter, a sixth embodiment of the present invention will be described with reference to the drawings. The semiconductor integrated circuit device of the sixth embodiment is similar in configuration to that of the first embodiment except an inter-power supply electrostatic discharge protection circuit, and therefore, the inter-power supply electrostatic discharge protection circuit will be mainly described below. FIG. 6 is a circuit diagram illustrating the configuration of the inter-power supply electrostatic discharge protection circuit 6 of the semiconductor integrated circuit device according to the sixth embodiment.

As shown in FIG. 6, the inter-power supply electrostatic discharge protection circuit 6 of the present embodiment is provided between a power supply line 22 and a ground line 23, and has: an NMIS transistor 24; a PMIS transistor 30; and gate voltage control circuits 7 and 31. The NMIS transistor 24 has: a source connected to the ground line 23 through which a ground voltage Vss is supplied; a drain connected to the power supply line 22 through which a power supply voltage $V_{DD}$ is supplied; and a gate connected to an output terminal of the gate voltage control circuit 7. On the other hand, the PMIS transistor 30 has: a drain connected to the ground line 23; a source connected to the power supply line 22 through which the power supply voltage $V_{DD}$ is supplied; and a gate connected to an output terminal of the gate voltage control circuit 31.

The gate voltage control circuit 7 is provided between the power supply line 22 and the ground line 23, and has a capacitor 25, a resistor 26 and a Schmidt trigger circuit 28. An end of the resistor 26 is connected to the power supply line 22 through which the power supply voltage $V_{DD}$ is supplied, while the other end of the resistor 26 is connected to an input terminal of the Schmidt trigger circuit 28. On the other hand, an end of the capacitor 25 is connected to the ground line 23 through which the ground voltage Vss is supplied, while the other end of the capacitor 25 is connected to the input terminal of the Schmidt trigger circuit 28. An output terminal of the Schmidt trigger circuit 28 is connected to the gate of the NMIS transistor 24. Instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

The gate voltage control circuit 31 is provided between the power supply line 22 and the ground line 23, and has a resistor 32, a capacitor 33 and a Schmidt trigger circuit 35. An end of the capacitor 33 is connected to the power supply line 22 through which the power supply voltage $V_{DD}$ is supplied, while the other end of the capacitor 33 is connected to an input terminal of the Schmidt trigger circuit 35. On the other hand, an end of the resistor 32 is connected to the ground line 23 through which the ground voltage Vss is supplied, while the other end of the resistor 32 is connected to the input terminal of the Schmidt trigger circuit 35. Instead of the capacitor 33, wiring capacitance, gate capacitance, junction capacitance or the like may alternatively be utilized. Furthermore, instead of the resistor 32, wiring resistance, gate resistance, transistor resistance or the like may alternatively be utilized.

Next, an operation of the above-described semiconductor integrated circuit device during an ESD test will be described with reference to FIGS. 10A and 10B again. Since the semiconductor integrated circuit device of the sixth embodiment is similar in configuration to the semiconductor integrated circuit device shown in FIG. 1 except the inter-power supply electrostatic discharge protection circuit 6, the description will be made also with reference to FIG. 1.

Like the fourth and fifth embodiments, the semiconductor integrated circuit device of the sixth embodiment is adaptable to the case where the power supply line 22 is placed in an open state and the voltage of the ground line 23 is fixed at the voltage Vss, and is also adaptable to the case where the voltage of the power supply line 22 is fixed at the voltage $V_{DD}$ and the ground line 23 is placed in an open state. A specific description will be made about this below.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 1 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the third embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage $V_{DD}$.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (n-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is decreased. In the present embodiment, as shown in FIG. 6, the resistor 32 and the Schmidt trigger circuit 35 are connected between the ground line 23 and the gate of the PMIS transistor 30. The Schmidt trigger circuit 35 exhibits hysteresis characteristic, and thus the waveform of a surge outputted therefrom is gentler than that of the surge inputted thereto. Therefore, once the PMIS transistor 30 has turned on, the turning off of the PMIS transistor 30 can be delayed. Accordingly, the PMIS transistor 30 can remain in on state for a longer period of time.

Besides, since the Schmidt trigger circuit 35 is provided, the resistance of the resistor 32 can be reduced. Accordingly, during normal operation, current consumption in the inter-power supply electrostatic discharge protection circuit 6 can be kept at a low level.

Seventh Embodiment

Figure 7:
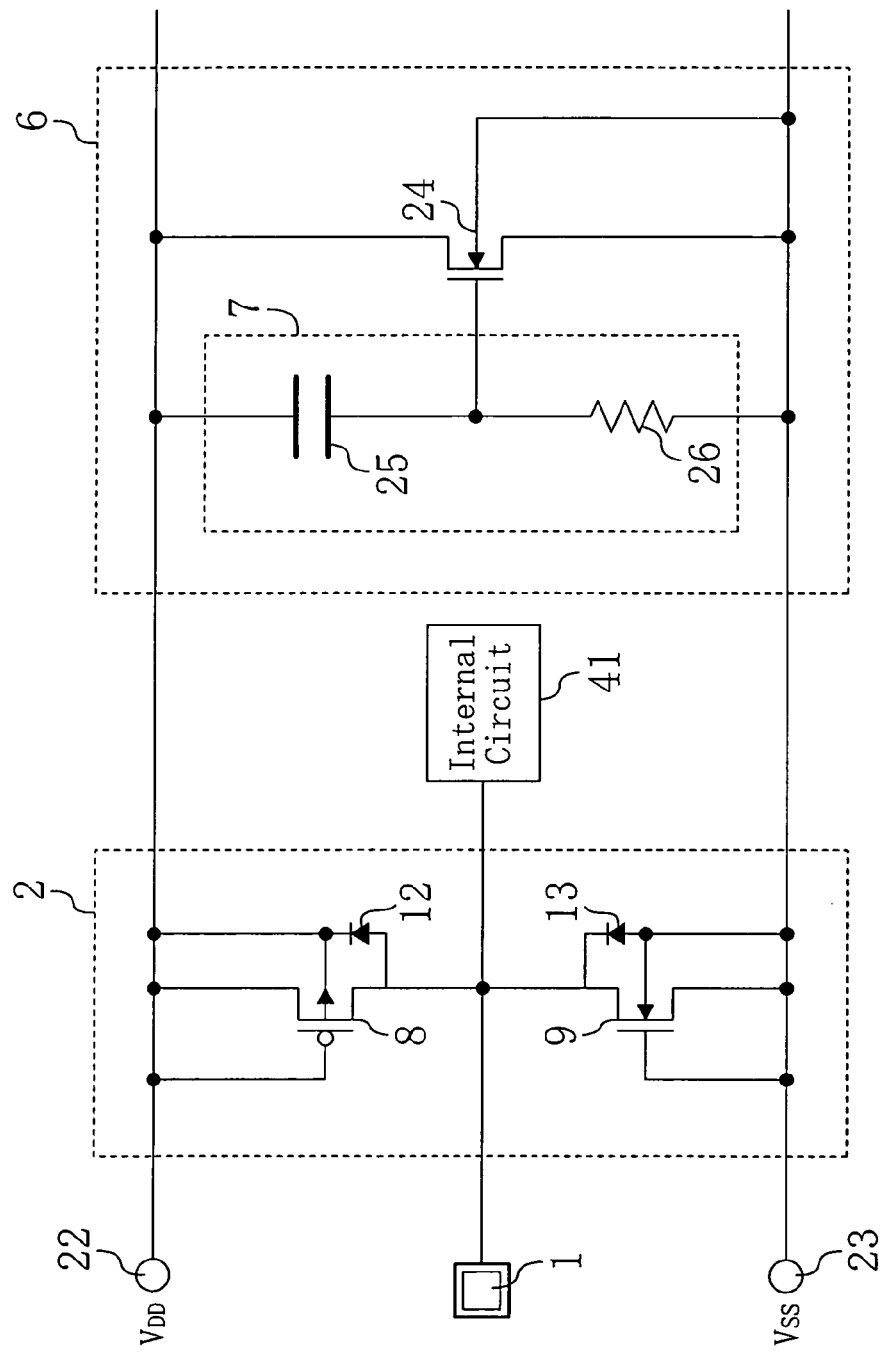
FIG. 7 is a circuit diagram illustrating the configuration of a semiconductor integrated circuit device including an electrostatic discharge protection circuit according to a seventh embodiment of the present invention.

Hereinafter, a seventh embodiment of the present invention will be described with reference to the drawings. FIG. 7 is a circuit diagram illustrating the configuration of a semiconductor integrated circuit device including an electrostatic discharge protection circuit according to the seventh embodiment. In the present embodiment, an input circuit will be described instead of the input/output circuit described in each of the first through sixth embodiments.

As shown in FIG. 7, the semiconductor integrated circuit device of the present embodiment includes: an external connection terminal 1; an electrostatic discharge protection circuit 2; an internal circuit 41; and an inter-power supply electrostatic discharge protection circuit 6. The electrostatic discharge protection circuit 2 and the inter-power supply electrostatic discharge protection circuit 6 are provided in order to protect the internal circuit 41 from a surge penetrated from the external connection terminal 1. In the inter-power supply electrostatic discharge protection circuit 6, a gate voltage control circuit 7 is provided. By providing the gate voltage control circuit 7, it becomes possible to control the gate voltage of an NMIS transistor 24 in the inter-power supply electrostatic discharge protection circuit 6 during an ESD test.

The electrostatic discharge protection circuit 2 is provided between the external connection terminal 1 and the internal circuit 41, and has a PMIS transistor 8 and an NMIS transistor 9. The PMIS transistor 8 has: a source connected to a power supply line 22 through which a power supply voltage $V_{DD}$ is supplied; a gate connected to the power supply line 22; a drain connected to the external connection terminal 1; and a substrate region (n-well) connected to the power supply line 22. On the other hand, the NMIS transistor 9 has: a source connected to a ground line 23 through which a ground voltage Vss is supplied; a gate connected to the ground line 23; a drain connected to the external connection terminal 1; and a substrate region (p-well) connected to the ground line 23.

The inter-power supply electrostatic discharge protection circuit 6 is provided between the power supply line 22 and the ground line 23, and has the NMIS transistor 24 and the gate voltage control circuit 7. The NMIS transistor 24 has: a source connected to the ground line 23 through which the ground voltage Vss is supplied; a drain connected to the power supply line 22 through which the power supply voltage $V_{DD}$ is supplied; and a gate connected to an output terminal of the gate voltage control circuit 7.

The gate voltage control circuit 7 is provided between the power supply line 22 and the ground line 23, and has a capacitor 25 and a resistor 26. An end of the capacitor 25 is connected to the power supply line 22 through which the power supply voltage $V_{DD}$ is supplied, while the other end of the capacitor 25 is connected to the output terminal of the gate voltage control circuit 7. On the other hand, an end of the resistor 26 is connected to the ground line 23 through which the ground voltage Vss is supplied, while the other end of the resistor 26 is connected to the output terminal of the gate voltage control circuit 7. In the present invention, instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

Next, an operation of the above-described semiconductor integrated circuit device during an ESD test will be described with reference to FIGS. 10A and 10B again.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 7 is placed in an open state, and the voltage of the ground line 23 is fixed at the voltage Vss. Then, the selector switch 152 is operated so that the charge power supply 150 allows electrical charges to be accumulated in the charge and discharge capacitor 151.

Thereafter, one electrode of the charge and discharge capacitor 151 is connected to the discharge resistor 153 via the selector switch 152. Thus, a positive electrical charge is applied to the external connection terminal 1 shown in FIG. 7.

In this case, in the path leading from the external connection terminal 1 to the power supply line 22, the pn junction between the drain region and the substrate region (n-well) of the PMIS transistor 8 serves as a parasitic forward diode 12. On the other hand, in the path leading from the external connection terminal 1 to the ground line 23, the pn junction between the drain region and the substrate region (p-well) of the NMIS transistor 9 serves as a parasitic backward diode 13.

A positive electrical charge applied to the external connection terminal 1 flows into the power supply line 22 through the parasitic forward diode 12, and the potential of the power supply line 22 is increased. In the present embodiment, the capacitor 25 is connected between the power supply line 22 and the gate of the NMIS transistor 24. Further, the resistor 26 is provided between the ground line 23 and the NMIS transistor 24.

Thus, when the potential of the power supply line 22 is increased, the gate potential of the NMIS transistor 24 is also increased. Therefore, the NMIS transistor 24 is likely to be turned on. If the NMIS transistor 24 is turned on, the positive electrical charge supplied to the external connection terminal 1 is discharged toward the ground line 23. In this case, the NMIS transistor 24 contributes to this discharge also as a parasitic bipolar transistor.

In the prior art, a positive surge applied to an external connection terminal flows through a parasitic diode, which is an NMIS transistor in an electrostatic discharge protection circuit, and the positive surge is then discharged to a ground line. However, since transistor size has been reduced in recent years, the NMIS transistor might be destroyed. To the contrary, in the present invention, a surge can be discharged to the ground line 23 through the NMIS transistor 24 in the inter-power supply electrostatic discharge protection circuit 6. As a result, a larger amount of surge current can be discharged, and degradation in surge resistance can be prevented.

The present embodiment has been described on the supposition that the input circuit is provided with the gate voltage control circuit 7 formed in the same way as that in the first embodiment. However, in the present invention, the gate voltage control circuit 7 may be formed in the same way as any of the gate voltage control circuits in the second through sixth embodiments. Even if any of these gate voltage control circuits is used, it is possible to achieve the effect of preventing degradation in surge resistance.

Eighth Embodiment

Figure 8:
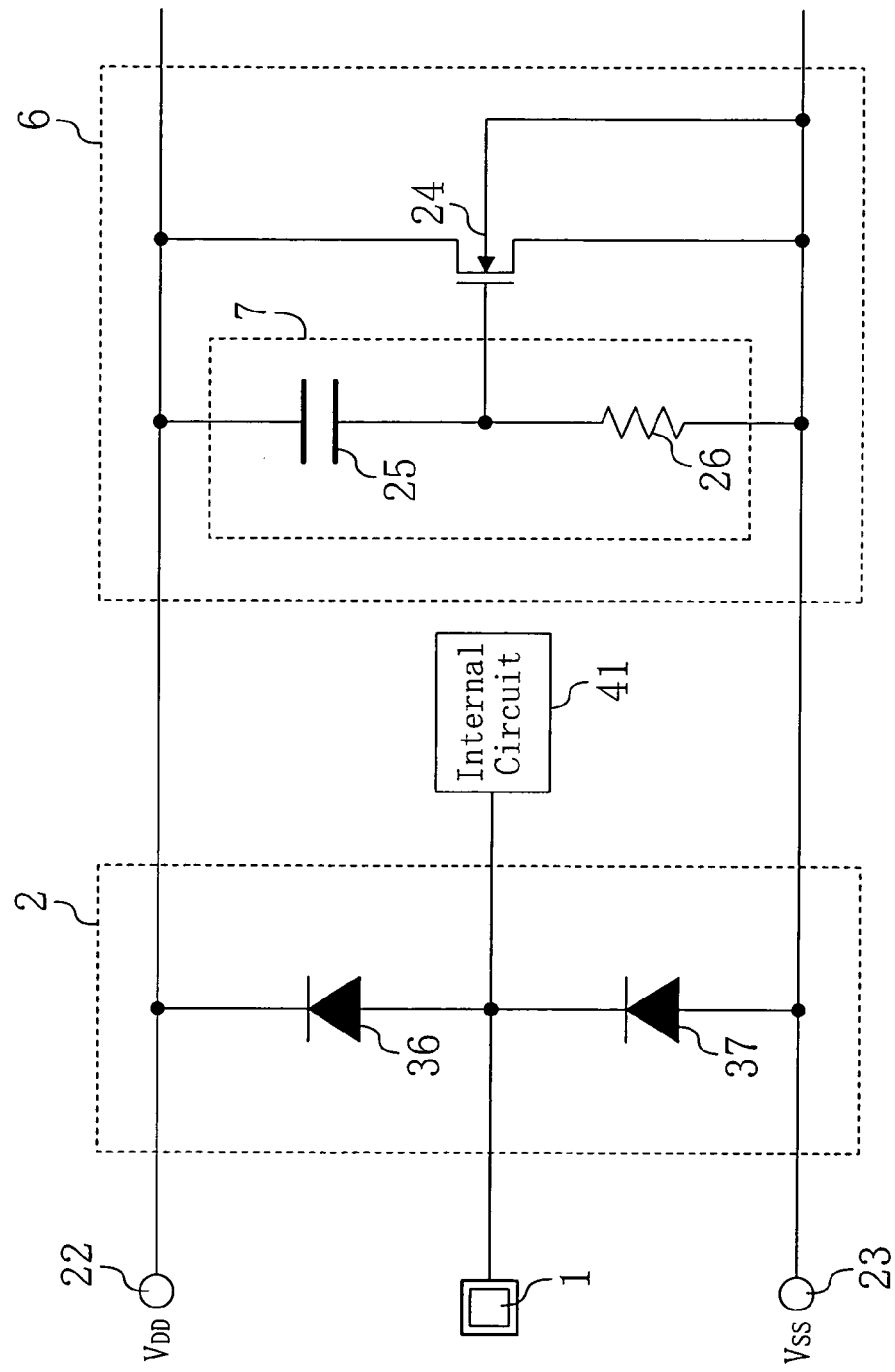
FIG. 8 is a circuit diagram illustrating the configuration of a semiconductor integrated circuit device including an electrostatic discharge protection circuit according to an eighth embodiment of the present invention.
Figure 9:
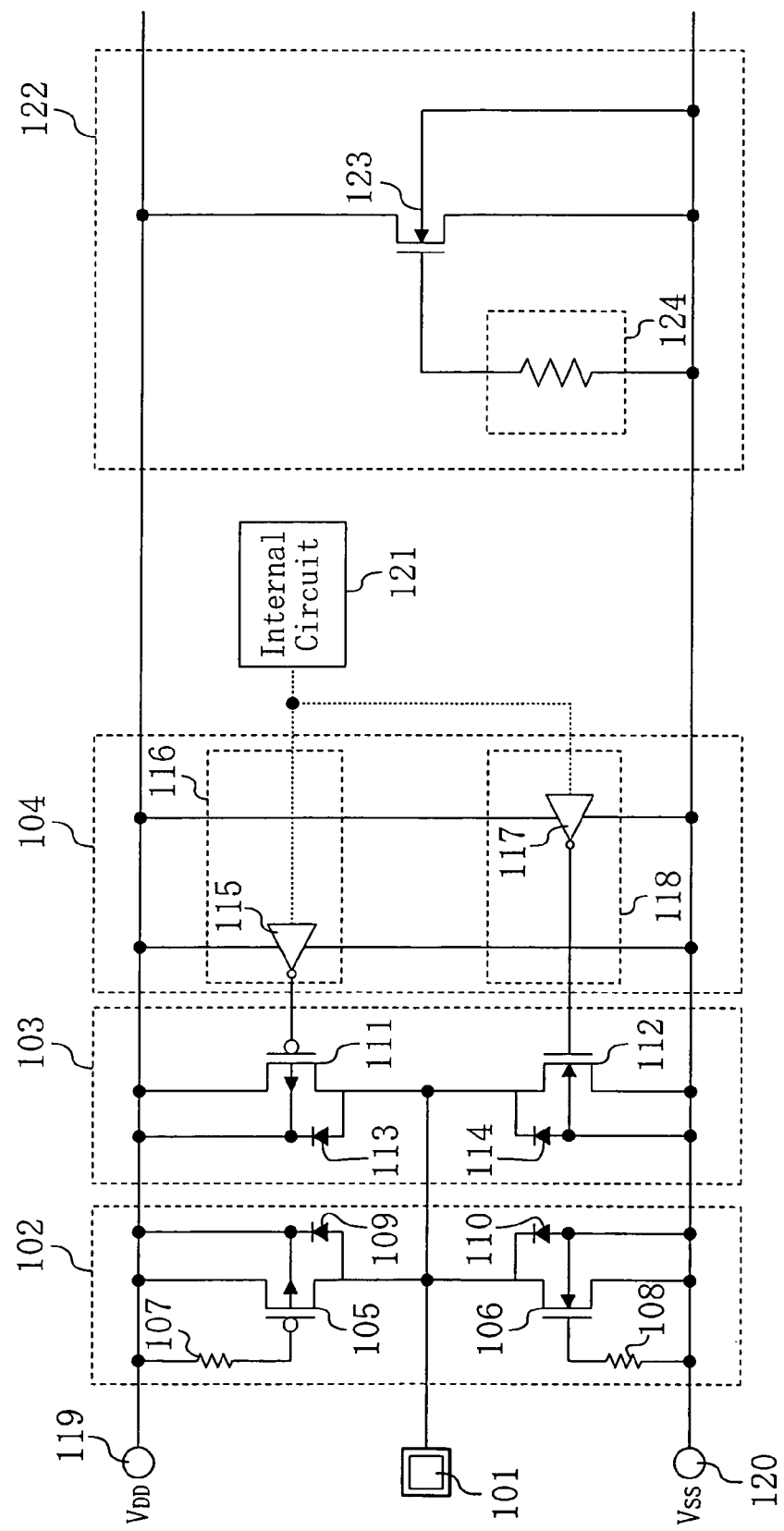
FIG. 9 is an electric circuit diagram illustrating the configuration of an output circuit of a conventional semiconductor integrated circuit device including an electrostatic discharge protection circuit, and the periphery of the output circuit.

Hereinafter, an eighth embodiment of the present invention will be described with reference to the drawings. FIG. 8 is a circuit diagram illustrating the configuration of a semiconductor integrated circuit device including an electrostatic discharge protection circuit according to the eighth embodiment.

As shown in FIG. 8, the semiconductor integrated circuit device of the present embodiment includes a gate voltage control circuit 7 as in the seventh embodiment. The eighth embodiment differs from the seventh embodiment in that an electrostatic discharge protection circuit 2 in the eighth embodiment is provided with PN diodes 36 and 37 instead of the PMIS transistor 8 and the NMIS transistor 9 (which are shown in FIG. 7). The configuration of each circuit will be described below in detail.

As shown in FIG. 8, the semiconductor integrated circuit device of the present embodiment includes: an external connection terminal 1; the electrostatic discharge protection circuit 2; an internal circuit 41; and an inter-power supply electrostatic discharge protection circuit 6. The electrostatic discharge protection circuit 2 and the inter-power supply electrostatic discharge protection circuit 6 are provided in order to protect the internal circuit 41 from a surge penetrated from the external connection terminal 1.

The electrostatic discharge protection circuit 2 is provided between the external connection terminal 1 and the internal circuit 41, and has the PN diodes 36 and 37. The PN diode 36 has: a cathode connected to a power supply line 22 through which a power supply voltage $V_{DD}$ is supplied; and an anode connected to the external connection terminal 1. On the other hand, the PN diode 37 has: an anode connected to a ground line 23 through which a ground voltage Vss is supplied; and a cathode connected to the external connection terminal 1.

The inter-power supply electrostatic discharge protection circuit 6 is provided between the power supply line 22 and the ground line 23, and has an NMIS transistor 24 and the gate voltage control circuit 7. The NMIS transistor 24 has: a source connected to the ground line 23 through which the ground voltage Vss is supplied; a drain connected to the power supply line 22 through which the power supply voltage $V_{DD}$ is supplied; and a gate connected to an output terminal of the gate voltage control circuit 7.

The gate voltage control circuit 7 is provided between the power supply line 22 and the ground line 23, and has a capacitor 25 and a resistor 26. An end of the capacitor 25 is connected to the power supply line 22 through which the power supply voltage $V_{DD}$ is supplied, while the other end of the capacitor 25 is connected to the output terminal of the gate voltage control circuit 7. On the other hand, an end of the resistor 26 is connected to the ground line 23 through which the ground voltage Vss is supplied, while the other end of the resistor 26 is connected to the output terminal of the gate voltage control circuit 7. In the present invention, instead of the capacitor 25, wiring capacitance, gate capacitance, junction capacitance or the like may alternatively be utilized. Furthermore, instead of the resistor 26, wiring resistance, gate resistance, transistor resistance or the like may alternatively be utilized.

Next, an operation of the above-described semiconductor integrated circuit device during an ESD test will be described with reference to FIGS. 10A and 10B again.

First, the semiconductor integrated circuit device of the present embodiment (which is used as the device to be tested 154 in FIG. 10A) is placed in the evaluation circuit. At this time, the power supply line 22 of the semiconductor integrated circuit device shown in FIG. 8 is placed in an open state, and the voltage of the ground line 23 is fixed at the voltage Vss. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 8.

In this case, in the path leading from the external connection terminal 1 to the power supply line 22, the PN diode 36 functions as a forward diode. On the other hand, in the path leading from the external connection terminal 1 to the ground line 23, the PN diode 37 functions as a backward diode.

A positive electrical charge applied to the external connection terminal 1 flows into the power supply line 22 through the PN diode 36, and the potential of the power supply line 22 is increased. In the present embodiment, the capacitor 25 is connected between the power supply line 22 and the gate of the NMIS transistor 24. Further, the resistor 26 is provided between the ground line 23 and the NMIS transistor 24.

Thus, when the potential of the power supply line 22 is increased, the gate potential of the NMIS transistor 24 is also increased. Therefore, the NMIS transistor 24 is likely to be turned on. If the NMIS transistor 24 is turned on, the positive electrical charge supplied to the external connection terminal 1 is discharged toward the ground line 23. In this case, the NMIS transistor 24 contributes to this discharge also as a parasitic bipolar transistor.

In the prior art, a positive surge applied to an external connection terminal flows through a parasitic diode, which is an NMIS transistor in an electrostatic discharge protection circuit, and the positive surge is then discharged to a ground line. However, since transistor size has been reduced in recent years, the NMIS transistor might be destroyed. To the contrary, in the present invention, a surge can be discharged to the ground line 23 through the NMIS transistor 24 in the inter-power supply electrostatic discharge protection circuit 6. As a result, a larger amount of surge current can be discharged, and degradation in surge resistance can be prevented.

The present embodiment has been described on the supposition that the input circuit is provided with the gate voltage control circuit 7 formed in the same way as that in the first embodiment. However, in the present invention, the gate voltage control circuit 7 may be formed in the same way as any of the gate voltage control circuits in the second through sixth embodiments. Even if any of these gate voltage control circuits is used, it is possible to achieve the effect of preventing degradation in surge resistance.

Other Embodiments

The positions of the respective circuits between the electrostatic discharge protection circuit 2 and the inter-power supply electrostatic discharge protection circuit 6, which have been described in the foregoing embodiments, are shown by way of example. In the present invention, each circuit may be provided at any position on a chip.

What is claimed is:

1. A semiconductor integrated circuit device comprising:
an external connection terminal;
an electrostatic discharge protection circuit connected to the external connection terminal;
a power supply line connected to the electrostatic discharge protection circuit;
a ground line connected to the electrostatic discharge protection circuit; and
an inter-power supply electrostatic discharge protection circuit that is connected to the power supply line and the ground line, and has a gate insulating element,
wherein the inter-power supply electrostatic discharge protection circuit comprises a first gate voltage control circuit capable of controlling the gate voltage of the gate insulating element, the gate insulating element is a first NMIS transistor whose source is connected to the ground line and whose drain is connected to the power supply line, and
the first gate voltage control circuit comprises: a first Schmidt trigger circuit connected at its output to the gate of the first NMIS transistor; a resistor whose one end is connected to the power supply line and whose other end is connected to an input of the first Schmidt trigger circuit; and a capacitor whose one end is connected to the ground line and whose other end is connected to the input of the first Schmidt trigger circuit, and
wherein the first Schmidt trigger circuit comprises: a first inverter section that is connected at its input to the other end of the resistor and the other end of the capacitor; a second inverter section that is connected at its input to the output of the first inverter section; a third inverter section that is connected at its input to the output of the second inverter section and is connected at its output to the gate of the first NMIS transistor; and a fourth inverter section that is connected at its input to the output of the second inverter section and is connected at its output to the input of the second inverter section.

2. The semiconductor integrated circuit device according to claim 1,
wherein the inter-power supply electrostatic discharge protection circuit further comprises;
a first PMIS transistor whose source is connected to the power supply line and whose drain is connected to the ground line; and
a second gate voltage control circuit capable of controlling the gare voltage of the first PMIS transistor.

3. The semiconductor integrated circuit device according to claim 2,
wherein the second gate voltage control circuit comprises: a second Schmidt trigger circuit connected at its output to the gate of the first PMIS transistor; a capacitor whose one end is connected to the power supply line and whose other end is connected to an input of the second Schmidt trigger circuit; and a resistor whose one end is connected to the ground line and whose other end is connected to the input of the second Schmidt trigger circuit.

4. The semiconductor integrated circuit device according to claim 1, wherein the device further comprises and input buffer circuit connected to the external connection terminal.

5. The semiconductor integrated circuit device according to claim 1, wherein the device further comprises:
an output circuit connected to the external connection terminal; and
and output prebuffer circuit connected to the output circuit.

6. The semiconductor integrated circuit device according to claim 5,
wherein the output prebuffer circuit comprises a first prebuffer circuit having at its last stage a first prebuffer connected to the power supply line, and a second prebuffer circuit having at its last stage a second prebuffer connected to the power supply line, and
wherein the output circuit comprises: a second PMIS transistor whose source is connected to the power supply line, whose drain is connected to the external connection terminal, whose gate is connected to an output terminal of the first prebuffer, and whose n-type substrate region is connected to the power supply line; and a second NMIS transistor whose source is connected to the ground line, whose drain is connected to the external connection terminal, whose gate is connected to an output terminal of the second prebuffer, and whose p-type substrate region is connected to the ground line.

7. The semiconductor integrated circuit device according to claim 1,
wherein the device further comprises an internal circuit connected to the external connection terminal.

8. The semiconductor integrated circuit device according to claim 1,
wherein the electrostatic discharge protection circuit comprises: a third PMIS transistor whose source is connected to the power supply line, whose drain is connected to the external connection terminal, and whose n-type substrate region is connected to the power supply line; and a third NMIS transistor whose source is connected to the ground line, whose drain is connected to the external connection terminal, and whose p-type substrate region is connected to the ground line.

9. The semiconductor integrated circuit device according to claim 8,
wherein the device further comprises:
a resistor interposed between the gate of the third PMIS transistor and the power supply line; and
a resistor interposed between the gate of the third NMIS transistor and the ground line.

10. The semiconductor integrated circuit device according to claim 1,
wherein the electrostatic discharge protection circuit comprises: a first PN diode whose end is connected to the power supply line and whose other end is connected to the external connection terminal; and a second PN diode whose one end is connected to the ground line and whose other end is connected to the external connection terminal.

* * * * *